United States Patent [19]

van der Velden

[11] 4,391,898

[45] Jul. 5, 1983

[54] METHOD OF MAKING A SLEEVE FOR A PRINTING CYLINDER

[75] Inventor: Hendricus J. van der Velden, RN Cuyck, Netherlands

[73] Assignee: Stork Screens, B.V., Boxmeer, Netherlands

[21] Appl. No.: 277,866

[22] Filed: Jun. 26, 1981

[30] Foreign Application Priority Data

Jul. 4, 1980 [NL] Netherlands ..................... 8003895

[51] Int. Cl.³ ............................................. G03F 7/02
[52] U.S. Cl. .................................... 430/306; 29/132; 29/148.4 D; 101/368; 101/DIG. 16; 156/215; 156/281; 156/286; 156/294; 156/311; 156/323; 430/307
[58] Field of Search ............... 156/215, 285, 286, 294, 156/311, 323, 281; 101/368, 475; 29/132, 148.4 D; 430/306, 307, 308

[56] References Cited

U.S. PATENT DOCUMENTS

| 2,721,601 | 10/1955 | Spencer | 156/294 |
| 3,010,194 | 11/1961 | Fratze | 156/294 |
| 3,575,756 | 4/1971 | Maus | 156/286 |
| 3,724,047 | 4/1973 | Peterson | 29/132 |
| 3,865,589 | 2/1975 | Freeman et al. | 430/306 |
| 3,928,101 | 12/1975 | Tucker | 156/286 |
| 3,962,394 | 6/1976 | Hall | 156/286 |

OTHER PUBLICATIONS

Parker et al., *Adhesion and Adhesives* Pergamon Press, New York, N.Y., (1966), pp.30–31.

*Primary Examiner*—Jerome W. Massie
*Attorney, Agent, or Firm*—Watson, Cole, Grindle & Watson

[57] ABSTRACT

Sleeve for a printing cylinder, said sleeve comprising a thin-walled cylindrical sieve, for instance a non-designed (plain-mesh) screen functioning as a support element, upon the outer face of which a photopolymer sheet is directly attached, said sheet being hardenable under the influence of radiation.

8 Claims, 5 Drawing Figures

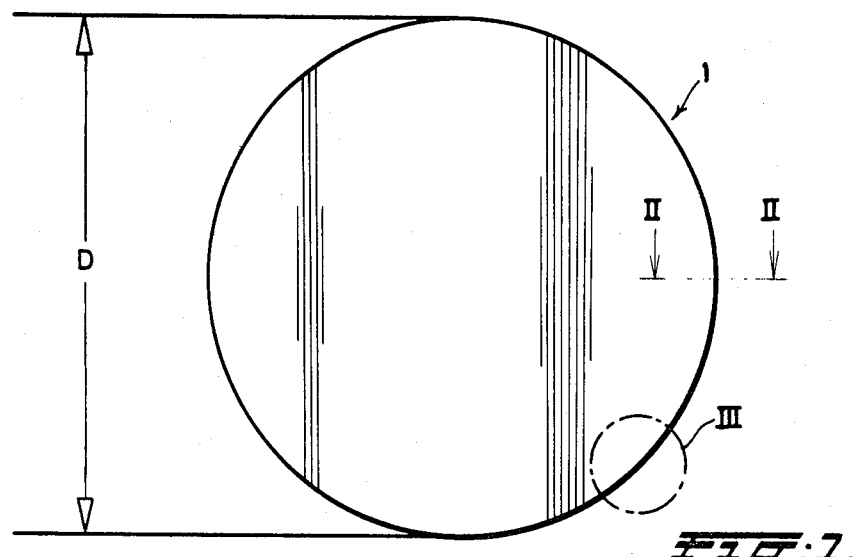
Fig. 1.
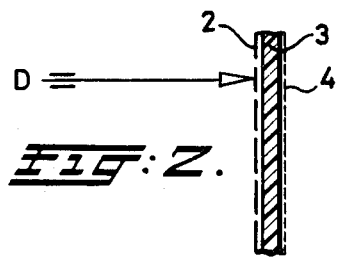
Fig. 2.
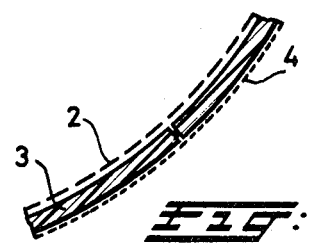
Fig. 3.
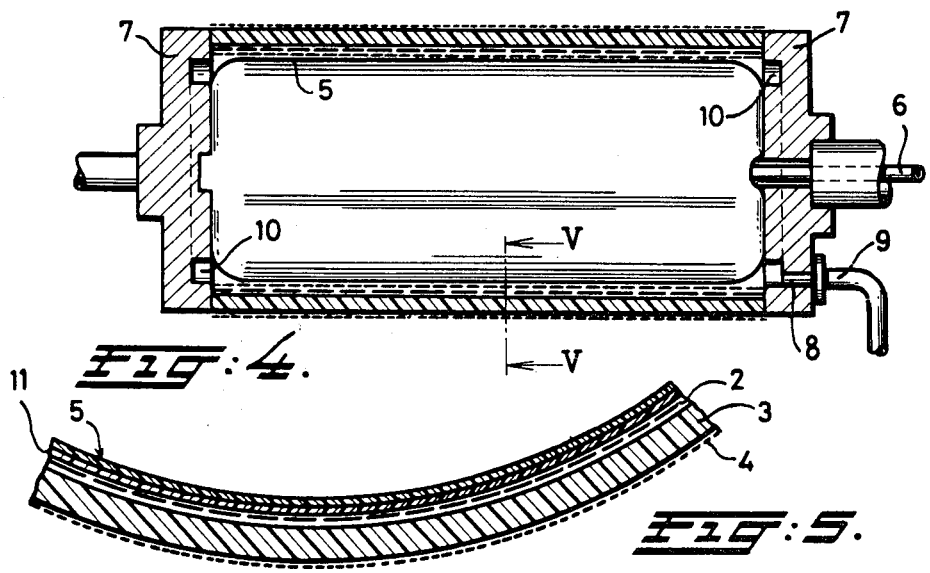
Fig. 4.
Fig. 5.

METHOD OF MAKING A SLEEVE FOR A PRINTING CYLINDER

RELATED APPLICATION

This application relates to U.S. Ser. No. 267,599, filed May 27, 1981, and commonly owned herewith.

BACKGROUND OF THE INVENTION

1. Field of the Invention

The present invention relates to a sleeve for a printing cylinder comprising a cylindrical support element provided with an external coating of a thermoplastic elastomeric composition (photopolymer) hardenable under the influence of radiation being wrapped around the support element as a sheet and affixed thereto by applying a raised temperature and pressure.

2. Description of Prior Art

Various forms of such a sleeve which is increasingly more frequently used in the printing process, are known from practice. The support element of such a known sleeve usually consists of a thick-walled cylinder which has a sufficient rigidity and to which the photopolymer sheet is fastened and secured by curing. In such a case two problems arise which strongly affect the quality of the printed material produced by means of said sleeve. When manufacturing the cylindrical sleeve pressure is applied so as to cause the photopolymer sheet to be properly secured to the support element. Applying such pressure may then result in rough or uneven areas being formed in the outer surface of the covering sleeve. Such irregularities are to be avoided as effectively as possible.

A second problem occurring with the known sleeves is the presence of air or gas inclusions between the photopolymer sheet and the support element. This likewise causes irregularities to occur in the printed material to be produced so that the quality of the work supplied by a printing machine provided with one or several of such cylindrical sleeves remains below the level desired.

SUMMARY OF THE INVENTION

It is a primary object of the present invention to provide a cylindrical sleeve being of such a structural design that the drawbacks described in the foregoing can be avoided.

According to the invention this object is attained in that the support element consists of a thin-walled cylindrical screen to which the photopolymer sheet is directly attached. Using a screen makes it possible to bring about by suction a removal of gas on the inner face of the photopolymer sheet and to produce a certain amount of vacuum in the same area. Thus the ambient atmosphere is capable of exerting an even pressure upon the coating, said pressure showing great uniformity over the entire surface. In addition, the screen affords removing air possibly still present or gases being developed, thus improving the adhesion of the photopolymer sheet to the support element.

In a favorable embodiment of the cylindrical sleeve according to the present invention the support element consists of a non-designed (i.e. plain-mesh) screen which may be produced in a known manner for instance from nickel having a thickness varying from 80 to 120 $\mu$m and a degree of perforation of 9-255 mesh. Such a screen which can be accurately manufactured lends itself particularly well for use as a support element for the cylindrical sleeve to be manufactured.

The present invention is also embodied in a cylindrical sleeve as described hereinbefore, the screen being disposed on a core in pretensioned condition, the photopolymer coating being provided with a pattern. In such a case the core ensures the shape stability, and a cylindrical sleeve of this type can be put into a printing machine without the need for any other measure.

The invention furthermore relates to a method of manufacturing a cylindrical sleeve according to which a thermoplastic coating of an elastomeric composition (a photopolymer) which is hardenable under the influence of radiation, is affixed to a support element by applying a raised temperature an pressure. To that end one starts from a thin-walled cylindrical screen which is placed on a rigid support whose outer surface is provided or covered with a pattern of channels leading to the lateral edges of the surface, whilst thereupon a sheet of the photopolymer is brought upon the screen surface and, subsequently, a vacuum is produced in the channels provided between the outer surface of the rigid support and the said sheet so as to remove gases present, and thereafter a heat treatment is carried out.

The advantage of said method consists in that the forces acting upon the photopolymer sheet during manufacture are very uniform and do not show any local increase or decrease, thus ensuring that the homogeneity as well as the dimensions of the coating obtained with said sheet are maintained without any alterations.

Preferably, after having placed the photopolymer sheet on the screen and after having produced the vacuum, a thin plastic foil is wrapped around said coating sheet before carrying out the heat treatment. Consequently, the uniform force, with which the coating sheet is being pressed upon the support element, is, as it were, being fixed and maintained after elimination of the vacuum applied.

In a favorable embodiment of the method according to the invention, the rigid support member used has the form of an inflatable bag around which first a porous, slightly compressible material is wrapped before placing the screen, while thereupon the sheet is affixed onto the screen, and subsequently the screen with coating is taken off the bag before carrying out the heat treatment. During the heat treatment the perforations in the screen provide an assurance that the gases possibly developing in the coating can escape without the forming of local accumulations.

The heat treatment of the coated screen is preferably carried out in three phases: first, at a temperature of approx. 140° C. for 20–120 min., followed by a brief cooling at room temperature lasting 5–10 min., and finally an aftertreatment at a temperature of approx. 140° C. for 5–60 min.

When it is desired that a designed sleeve be manufactured, the method described so far is supplemented in a manner so that, after having accomplished the heat treatment, the sleeve thus obtained is, in a very close fitting relation, brought on an accurately cylindrical rigid core whereupon the pattern-providing process is carried out in a known manner by means of radiation. When placing the sleeve on the core, the fit may have a negative tolerance, in which case the cylindrical sleeve is forced on the core by a locally applied fluid supplied under pressure.

Furthermore, the invention is embodied in an apparatus for carrying out the method as indicated hereinbefore, said apparatus being provided in a known manner with a supporting means for the screen to be coated. According to the invention the apparatus comprises two disks which may be coaxially disposed on both sides against the supporting means, at least one of the two disks being provided with a passage which on one side is capable of communicating with the channels on the outer surface and on the other side has a connection for communicating with a vacuum source.

The features of the present invention which are believed to be novel are set forth with particularity in the appended claims.

Other claims and many of the attendant advantages will be more readily appreciated as the same becomes better understood by reference to the following detailed description and considered in connection with the accompanying drawings in which like reference symbols designate like parts throughout the Figures.

DESCRIPTION OF THE DRAWINGS

FIG. 1 is a cross-sectional view of a coated case;

FIG. 2 is a sectional view, greatly enlarged, of a small part of the length of the sleeve taken along section II—II of FIG. 1;

FIG. 3 is a greatly enlarged view of the detail III of FIG. 1;

FIG. 4 is a longitudinal section through the most important portion of the apparatus for producing a cylindrical sleeve according to FIGS. 1-3;

FIG. 5 is a sectional view, on a greatly enlarged scale, of a portion of the section taken on line V—V of FIG. 4.

DESCRIPTION OF THE PREFERRED EMBODIMENTS

The sleeve 1 as per FIGS. 1-3 is composed of a cylindrical support element 2, which in this case consists of a non-designed or plain-mesh screen. Said support element is provided with an external coating 3 wrapped around the support element 2 like a sheet (FIG. 3). This coating 3 consists of a thermoplastic elastomeric composition (a photopolymer) which is hardenable under the influence of radiation. The coating sheet 3, which is firmly secured onto the screen 2 in a manner as yet to be described hereinafter, is initially covered with a protective foil (not shown) which, during the first phase of the manufacturing method, is removed and replaced by a tightly wound thin foil 4. As a result of its composition, the coating 3 makes it possible to obtain a particular pattern by use of radiation. The exposure to said radiation (for example, by light) then proceeds via a mask which forms a negative image. The parts of coating 3 that have been exposed to the radiation harden, so that after ending the exposure the unexposed parts of the coating 3 may be washed out or removed in another fashion so as to produce (in a conventional manner) the intended pattern.

The process of manufacturing the cylindrical case 1 consists of a series of operations which may be subdivided into three coherent parts. By using this method, it is possible to obtain a non-designed sleeve which in continuation of the method to be described hereinafter, may be provided with a pattern according to the method as had just briefly been indicated.

The method for producing the sleeve 1 comprises the following steps:

point of departure is a support element 2, for example a screen which can be provided with perforations having a value ranging from 9 to 225 mesh (i.e. openings per inch) and preferably having a mesh value from 60 to 120. The screen surface is not allowed to contain uneven areas other than the perforations, which condition can be very well achieved by means of the present state of the art as applicable to the manufacturing of screens;

the thickness of the screen may lie between 80-120 $\mu$m;

the screen is degreased, for which purpose any known process may be used, acid degreasing being preferred, however;

therupon the screen is dried for e.g. 10 min. at a temperature of 180° C.;

subsequently a photopolymer sheet as available is cut to proper size, so that in a subsequent phase of the method the sheet can be wrapped around the screen 2 in such a manner that the cutting edges of the sheet just lie against each other, see FIG. 3.

So far then the first phase of the method. In the subsequent, second phase, a supporting means is used which is shown in FIG. 4 and which in this case consists of an inflatable air bag. This bag 5 has a pipe 6 through which it is possible to inflate or deflate the bag. On both sides against the bag 5 there may be coaxially disposed two disks 7 extending in radial direction beyond the supporting means (the air bag 5). The right-hand disk 7 shown in FIG. 4 is provided with a passage 8. The location of said passage is such as to afford communication with the outer surface of the bag 5. The passage 8 is, on the outer face of the disk 7, provided with an annular groove 10 the purpose of which will be explained in the description now following of the second phase of the method.

A porous slightly compressible material, for instance a non woven fabric 11, is wrapped around the air bag 5. This is done with the object to cover the outer surface of the supporting means 5 with a pattern of channels leading to the lateral edges of said outer surface;

the screen 2 is pushed around the air bag 5 thus wrapped;

the air bag is inflated up to a pressure of 89 kPa so as to form in this manner the rigid support required for the screen 2;

the photopolymer sheet cut to size with the protective foil still present is put tightly around the screen 2 so that the situation arises as is shown in FIG. 3;

thereupon the disks 7 are fitted on, which produces a certain degree of sealing between the inwardly directed side of each flange and the end sides of the photopolymer sheet 3. If needed, a sealing strip may be fitted around the area of separation between the disks 7 and the photopolymer sheet;

thereupon the connection 9 is put into communication with a vacuum source so that there arises a certain amount of vacuum along the outer circumference of the air bag 5. Due to the presence of the non woven fabric 11 and the perforations in the screen 2, this vacuum is capable of penetrating down to the photopolymer sheet 3 which is thus pressed tightly upon the screen 2 by the ambient atmospheric pressure;

in this condition the protective foil (not shown) is removed from the photopolymer sheet 3 and the thin foil 4, of, for instance, PVC or polyethylene is tightly wrapped around the sheet. The zone of overlapping of this foil lies in a position staggered with respect to the seam shown in FIG. 3 and formed between the cut-off ends of the photopolymer sheet 3;

the vacuum is eliminated by connecting the passage 8 in flange member 7 to the atmosphere. Also, the pressure within the air bag 5 can escape through the pipe 6;

the disks 7 are removed and the screen 2 with the coating 3 wrapped around it is loosened from the bag.

This ends the second phase of the method which may now proceed to the third phase which is concerned with the thermal treatment.

The coated screen is subjected to a temperature of approx. 140° C. in a curing oven for 20-120 min., and preferably for 60 min.;

following this curing process, the screen with coating is cooled outside the curing oven for 5-10 min.;

finally the screen with coating is subjected again in the oven to a temperature of about 140° C. for 5-60 min. This subsequent curing process preferably takes 10 min.;

thereupon the screen with the coating secured thereto by curing is cooled, and so the intended sleeve is obtained, terminating the third phase of the method.

Subsequently, the sleeve thus obtained may be provided with a pattern in a conventional manner, which has been touched upon in the foregoing. In such a case the cylindrical sleeve may be pushed on an accurately cylindrical rigid core, while having regard for a close fit. It is then possible to apply a fit having a negative tolerance. If so, the sleeve 1 can be pushed over the said core by means of a locally applied fluid supplied under pressure. To this end, the core may be provided with a number of apertures through which high-pressure air can flow out. The air supplied then serves as a "lubricant" and as a fluid bringing about a slight stretching of the cylindrical sleeve. When the sleeve 1, i.e. the screen 2 together with the coating 3, has been fitted on the core, the pattern-providing process may be carried out.

When printing with the designed sleeve is to take place regularly, it may be left on the core. If, however, printing with the sleeve is not needed over an extended period of time or ceases to be needed, it is possible, by using the pneumatic method just indicated, to remove the sleeve from the core again for storing. Also, if it happens that the cylindrical sleeve is to be shipped, it must first be taken off the core.

Successful tests have been conducted with a screen of 80 mesh made of nickel which is provided with a photopolymer coating in accordance with the method described hereinbefore. It may also be indicated that in the test a polymer sheet 3 having a thickness of approx. 3 mm was used in conjunction with a protective foil of 200 μm. The thin foil 4 had a thickness of 15 μm. The sleeve so constituted was placed on a core having an outer diameter being 0.2 mm larger than the inner diameter of the sleeve. By using the pneumatic method as described, such a sleeve could be very tightly secured on the core to be used as a printing cylinder in a printing machine.

An important feature of the cylindrical sleeve and the method according to the present invention consist in the use of a support element in the form of a thin-walled cylindrical screen. This affords making use of a vacuum for fixing the outer coating of the support element with a photopolymer, in which case a very uniform pressure evenly distributed over the entire surface can be exerted upon the photopolymer coating, while effectively preventing the occurrence of gas inclusions. The thin foil 4 used ensures the necessary force with which the photopolymer coating 3 is retained on the screen 2, while gases possibly being liberated during the heat treatment can freely escape through the perforations in the screen.

What is claimed is:

1. A method of forming a cylindrical sleeve for a printing cylinder, comprising the steps of disposing a thin-walled cylindrical screen about the outer surface of a temporary, rigid, cylindrical support, said screen defining a pattern of interconnected channels extending to the lateral edges of said surface, applying a sheet of elastomeric composition which is hardenable under the influence of radiation about said screen, said sheet comprising a photopolymer, applying a vacuum to said channels for removing any accumulated gases between the outer surface of said support and said sheet, wrapping a thin plastic foil about said sheet, and therein subjecting said sheet to a heat treatment for securing said screen and sheet together by curing.

2. Method according to claim 1, further comprising the steps of degreasing said screen using an acid liquid substance, drying said degreased screen for at least 8 min. at a temperature of at least 150° C., said degreasing and drying steps being carried out before disposing said screen about said outer surface.

3. A method of forming a cylindrical sleeve for a printing cylinder, comprising the steps of providing a temporary, rigid, cylindrical support which comprises an inflatable bag, wrapping a porous, slightly compressible material about said bag, disposing a thin-walled cylindrical screen about said material, said screen defining a pattern of interconnected channels extending to the lateral edges of said bag, applying a sheet of elastomeric composition which is hardenable under the influence of radiation about said screen, said sheet comprising a photopolymer, applying a vacuum to said channels for removing any accumulated gases between the outer surface of said bag and said sheet, and thereafter subjecting said sheet to a heat treatment for securing said screen and sheet together by curing, the heat treatment being carried out after removing said screen and said sheet from said bag.

4. Method according to claim 3, further comprising the steps of inflating the bag under pressure to 80 kPa before carrying out the removal step, and said material comprising a non-woven fabric.

5. A method of forming a cylindrical sleeve for a printing cylinder, comprising the steps of disposing a thin-walled cylindrical screen about the outer surface of a temporary, rigid, cylindrical support, said screen defining a pattern of interconnected channels extending to the lateral edges of said surface, applying a sheet of elastomeric composition which is hardenable under the influence of radiation about said screen, said sheet comprising a photopolymer, applying a vacuum to said channels for removing any accumulated gases between the outer surface of said support and said sheet, and thereafter subjecting said sheet to a heat treatment for securing said screen and said sheet together by curing, said heat treatment being carried out in three phases: first at a temperature of about 140° C. for 20 to 120 min., followed by a brief cooling at room temperature for 5 to 10 min., and finally an aftertreatment at a temperature of about 140° C. for 5 to 60 min.

6. Method according to claim 5, wherein the first phase is carried out for 60 min., the second phase for 10 min. and the third phase for 10 min.

7. A method of forming a cylindrical sleeve for a printing cylinder, comprising the steps of disposing a thin-walled cylindrical screen about the outer suface of a temporary, rigid, cylindrical support, said screen defining a pattern of interconnected channels extending to the lateral edges of said surface, applying a sheet of elastomeric composition which is hardenable under the influence of radiation about said screen, said sheet comprising a photopolymer, applying a vacuum to said channels for removing any accumulated gases between the outer surface of said support and said sheet, and subjecting said sheet to a heat treatment for securing said screen and sheet together by curing, the heat treatment being carried out after removing said screen and said sheet from said support, and thereafter closely fitting said secured together screen and sheet after the heat treatment about a cylindrical core member, and providing a pattern on the outer surface of said sheet using a radiation process.

8. The method according to claim 7, wherein said secured together screen and sheet is closely fit about said core member using a negative tolerance and by applying a fluid supplied thereto under pressure.

* * * * *